US006913955B1

(12) United States Patent
Horch et al.

(10) Patent No.: US 6,913,955 B1
(45) Date of Patent: Jul. 5, 2005

(54) METHOD OF MANUFACTURING A THYRISTOR DEVICE WITH A CONTROL PORT IN A TRENCH

(75) Inventors: Andrew Horch, Mountain View, CA (US); Scott Robins, San Jose, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/262,792

(22) Filed: Oct. 1, 2002

(51) Int. Cl.[7] .............................................. H01L 21/332

(52) U.S. Cl. ...................... 438/133; 438/135; 438/137; 438/138; 257/107; 257/117

(58) Field of Search ................................ 438/133, 135, 438/137–138, 146, 163; 257/107, 117, 124, 133

(56) References Cited

U.S. PATENT DOCUMENTS

| | | | | |
|---|---|---|---|---|
| 4,520,552 A | * | 6/1985 | Arnould et al. | 438/621 |
| 5,001,535 A | * | 3/1991 | Nishizawa et al. | 257/169 |
| 5,838,026 A | * | 11/1998 | Kitagawa et al. | 257/139 |
| 5,950,075 A | * | 9/1999 | Terasawa | 438/133 |
| 6,104,045 A | | 8/2000 | Forbes et al. | |
| 6,225,165 B1 | | 5/2001 | Noble, Jr. et al. | |
| 6,229,161 B1 | | 5/2001 | Nemati et al. | |
| 6,727,528 B1 | * | 4/2004 | Robins et al. | 257/133 |
| 2001/0041407 A1 | * | 11/2001 | Brown | 438/270 |

FOREIGN PATENT DOCUMENTS

| | | | | |
|---|---|---|---|---|
| EP | 476296 A1 | * | 3/1992 | ........... H01L/29/62 |
| JP | 55099774 A | * | 7/1980 | ........... H01L/29/74 |
| JP | 02035714 A | * | 2/1990 | ......... H01L/21/265 |

OTHER PUBLICATIONS

K. DeMeyer, S. Kubicek and H. van Meer, *Raised Source/Drains with Disposable Spacers for sub 100 nm CMOS technologies*, Extended Abstracts of International Workshop on Junction Technology 2001.

Mark Rodder and D. Yeakley, *Raised Source/Drain MOSFET with Dual Sidewall Spacers*, IEEE Electron Device Letters, vol. 12, No. 3, Mar. 1991.

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

N. Lindert, Y.–K, Choi, L. Chang, E. Anderson, W.–C. Lee, T.–J. King, J. Bokor, and C. Hu, *Quasi–Planar FinFETs with Selectively Grown Germanium Raised Source/Drain*, 2001 IEEE International SOI Conference, Oct. 2001.

(Continued)

*Primary Examiner*—George Eckert
*Assistant Examiner*—José R. Diaz

(57) ABSTRACT

A thyristor-based semiconductor device has a control port formed in a trench having a height-to-width aspect ratio that can be prohibitive to filling a bottom portion of the trench with an insulative material. According to an example embodiment of the present invention, a trench is formed in the substrate adjacent to a thyristor region, and a control port is formed near a bottom of the trench. An upper portion of the trench is then filled, thereby covering the control port. The control port is adapted to reduce the aspect ratio of a remaining portion of the trench over the control port, making it possible to fill trenches having a high height-to-width aspect ratio (e.g., at least 2:1). The thyristor control port is capacitively coupled to the thyristor region via a dielectric on a sidewall of the trench, and is configured and arranged to control current in the thyristor body via the capacitive coupling. This approach is also useful, for example, in high-density memory applications where trenches having high aspect ratios are desired, and in applications where thyristors having a cathode-down arrangement are desired.

13 Claims, 10 Drawing Sheets

OTHER PUBLICATIONS

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide,* 1998 Symposium on VLSI Technology Digest of Technical Papers.

Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain,* IEEE Transactions on Electron Devices, vol. 48, No. 8, Aug. 2001.

* cited by examiner

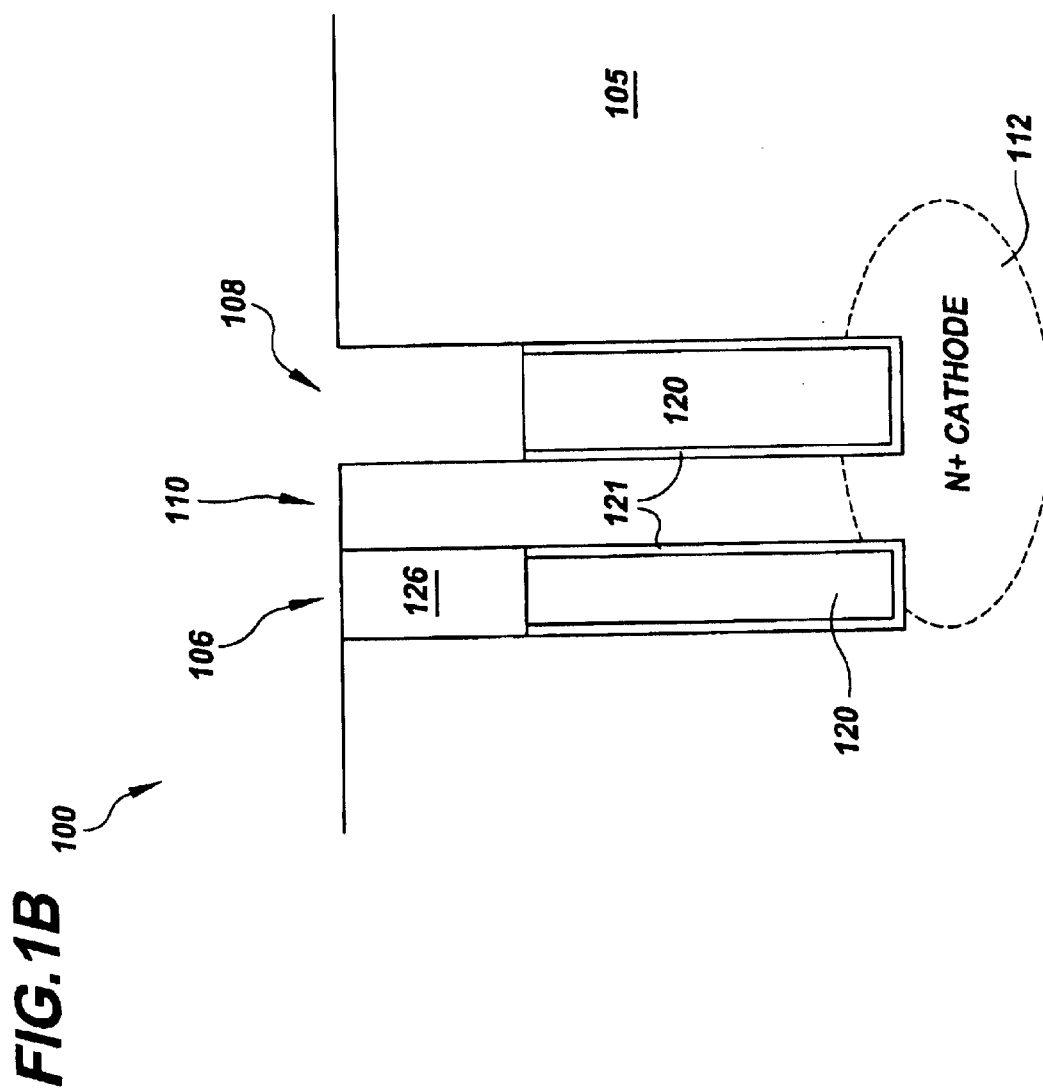

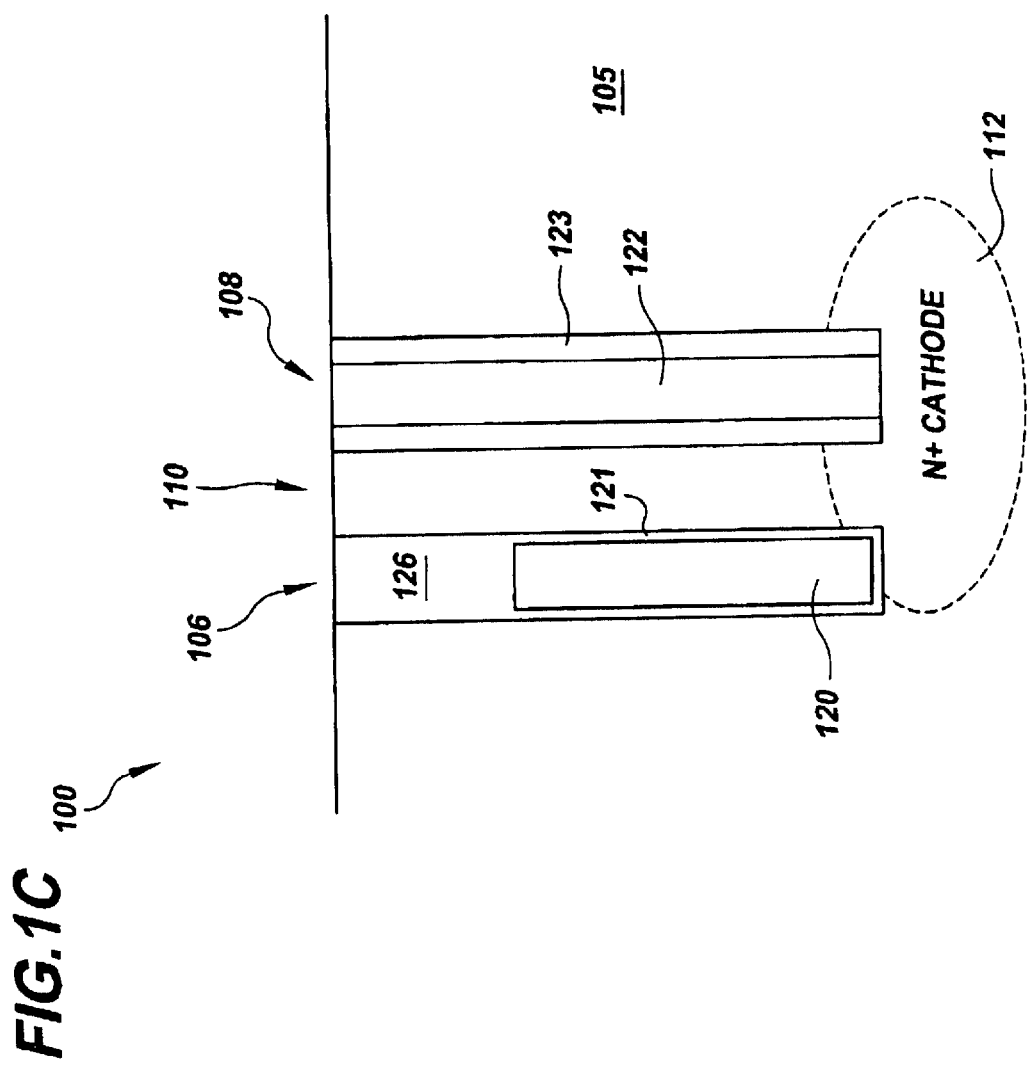

METHOD OF MANUFACTURING A THYRISTOR DEVICE WITH A CONTROL PORT IN A TRENCH

Related Patent Documents

This patent document is related to U.S. patent application Ser. No. 10/262,729, entitled "Trench Isolation for Thyristor-based Device," to U.S. patent application Ser. No. 10/262,728, now U.S. Pat. No. 6,666,481 entitled "Shunt Connection to Buried Emitter for Thyristor-based Semiconductor Device" and to U.S. patent application Ser. No. 10/262,758, entitled "Varied Trench Depth for Thyristor Isolation," all of which are filed concurrently herewith and fully incorporated herein by reference.

FIELD OF THE INVENTION

The present invention is directed to semiconductor devices and, more specifically, to thyristor-based semiconductor devices, such as thyristor-based memory devices and other thyristor-based current-switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively-coupled thyristor-type devices, includes forming devices in a very dense array for a variety of applications, such as memory cell applications. In order to achieve such a dense array, it is sometimes desirable to form trenches having a very high aspect ratio (the ratio of height-to-width of the opening of the trench). Portions of the devices must be electrically insulated from other circuitry; however, and commonly used insulative materials are difficult to implement when filling trenches having an aspect ratio of greater than about 2:1. As the aspect ratio is increased, filling the trenches becomes even more difficult.

These and other design considerations have presented challenges to efforts to implement such a thin capacitively coupled thyristor in bulk substrate applications, and in particular to highly dense applications.

SUMMARY

The present invention is directed to overcoming the above-mentioned challenges and others related to the types of devices and applications discussed above and in other circuits, such as memory circuits. The present invention is exemplified in a number of implementations and applications, some of which are summarized below.

According to an example embodiment of the present invention, a thyristor-based (i.e., thyristor-including) semiconductor device is manufactured in a manner that makes possible the use of high-aspect-ratio trenches, which in turn improves the ability to form devices in a dense circuit arrangement. In this example embodiment, a substrate includes a thyristor body region and an adjacent trench below an upper surface of the substrate and having a relatively large height-to-width aspect ratio (e.g., greater than 2:1). Such a large aspect ratio makes it difficult to completely fill a bottom portion of the trench with insulative material; inter alia, because the insulative material tends to close an upper portion of the trench before the bottom portion is filled, leaving airspace in the bottom portion. Insulative liner material is then lined in the bottom of the trench, and conductive material is filled in the lined bottom portion of the trench and below the substrate surface. Generally, this approach facilitates the ability to completely fill an upper portion of the trench with insulative material, and the implementation of dense circuit arrays using high-aspect-ratio trenches.

In a more specific example embodiment, the above-described approach permits thyristor-based semiconductor devices to be manufactured with an emitter end of the thyristor body being below the substrate surface. The emitter end of the thyristor includes an emitter region and a base region, with the emitter region being coupled in series with a pass device, such as a pass transistor. In one implementation, the emitter end below the surface is a cathode emitter, and in another implementation, the emitter end below the surface is an anode emitter. The conductive material in the trench includes a control port that is arranged to capacitively couple a signal to the base region of the emitter end below the surface. The insulative liner includes a dielectric on a portion of a sidewall of the trench that faces the thyristor body region, and the capacitive coupling is made via the dielectric.

In another particular example embodiment of the present invention, a memory arrangement is formed having a memory cell including a thyristor-based semiconductor device such as those discussed above. The memory arrangement includes a thyristor having anode and cathode end portions, with the cathode end portion being buried in a substrate, each end portion having a base region electrically coupled to an emitter region, and each base region being electrically coupled to one another. The thyristor further includes a control port adapted to capacitively couple to the base region of the cathode end portion. The memory cell also includes a pass device having source/drain regions separated by a channel region and a gate adapted to capacitively couple to the channel region. One of the source/drain regions is coupled in series with the thyristor at a first one of the emitter regions, and another one of the source/drain regions is coupled to a bit line. A first word line is adapted to apply a voltage to the gate of the pass device for controlling current flow therein, and the pass device forms a conductive link between the bit line and the thyristor when the pass device is in a conducting state. A second word line is adapted to apply a voltage to the control port of the thyristor for controlling current flow therein, and a second one of the emitter regions is coupled to a conductor at a reference voltage.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 1A–1D show a semiconductor device at various stages of manufacture, according to an example embodiment of the present invention, in which:

FIG. 1A is a semiconductor device being formed having a high-aspect-ratio trench;

FIG. 1B is the semiconductor device of FIG. 1A having a dielectric and control port formed in the trench of FIG. 1A;

FIG. 1C is the semiconductor device of FIG. 1B having a cathode contact formed in a trench; and FIG. 1D is the semiconductor device of FIG. 1C having thyristor body regions and a pass device being formed, according to another example embodiment of the present invention;

Figure 1A:
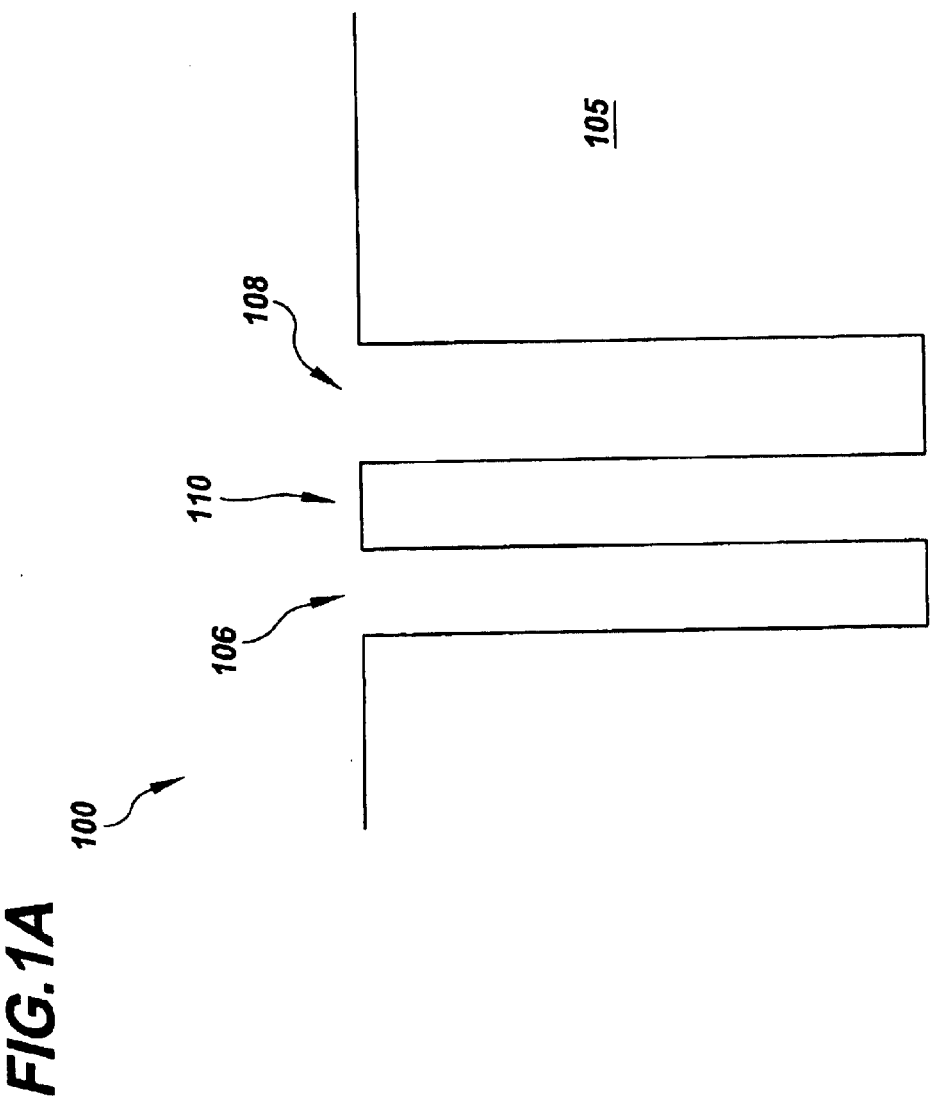

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications benefiting from high-aspect-ratio trenches and/or implementations with an emitter region below a substrate surface. While the present invention is not necessarily limited to such applications, various aspects of the invention may be appreciated through a discussion of various examples using these contexts.

According to an example embodiment of the present invention, a thyristor is formed with a thyristor control port located near a lower portion of a trench having a high aspect ratio. The trench is formed in a semiconductor substrate and adjacent to a thyristor region therein. The trench has a substantially high aspect (height-to-width) ratio of at least about 2:1, which is desirable in high-density implementations but has been prohibitive to filling a lower portion of the trench with typical insulative material processes. This issue is overcome by forming a dielectric on a sidewall of the trench facing the thyristor region, and by reducing the aspect ratio by forming a control port near the bottom of the trench. The control port is adapted for controlling current in the thyristor region by capacitively coupling a signal to the thyristor region via the dielectric. The presence of the control port within the trench reduces the aspect ratio of a remaining upper portion of the trench, which is then filled, such as with insulative material, conductive material and/or other portions of the thyristor or other circuitry in the substrate.

FIGS. 1A through 1D show cross-sectional views of a thyristor-based semiconductor device 100 in various stages of manufacture, according to a particular example embodiment of the present invention. In FIG. 1A, the semiconductor device 100 is masked and trench regions 106 and 108 are etched in a substrate 105 adjacent to and at least partially surrounding a thyristor body portion 110. The trench portion 106 also has a substantially high aspect ratio, as discussed above.

After forming the trench regions 106 and 108, dielectric 121 at bottom and sidewall portions of the trench regions, and a control port 120 is then formed using a conductive material (e.g., polysilicon) in a lower portion of the lined trench regions. The filled portion of the trench regions 106 and 108, including the control port 120 and the dielectric 121, reduces the aspect ratio of the remaining unfilled portions of the trench regions over the control port 120. Insulative material 126, such as oxide, is then formed over the control port 120 and fills the remaining portion of the trench regions 106 and 108 without difficulty due to the relative depth of the trench regions being reduced by the filled lower portions thereof. In one implementation, the control port 120 reduces the aspect ratio of the remaining upper portion of the trench region 106 to less than a 2:1 aspect ratio. In alternate implementations, the insulative material 126 is replaced and/or combined with other materials, such as polysilicon and other conductive materials.

In FIG. 1C, the potion of the control port 120 in the trench region 108 is removed and a portion of the substrate 105 below the trench regions 106 and 108 is implanted via the trench region 108 to form an N+ cathode-emitter region 112 of the thyristor. A portion of the trench region 108 is then lined with insulative liner 123, such as an oxide. The insulative liner 123 may, for example, include a portion of the liner 121 shown in FIG. 1B. Alternatively, some or all of the liner 121 may also be removed, prior to the formation of additional insulative liner 123. In one implementation, the insulative liner 123 and the insulative material 126, respectively in trench regions 108 and 106, have the same composition and are formed in the same step. In another implementation, the insulative liner 123 and insulative material 126 have different compositions.

After the trench region 108 is filled with the liner 123, a portion of the liner 123, including liner material at the bottom of the trench region, is removed and the contract 122 is formed where the portion of the liner 123 has been removed. Some of the contact 122 is optionally etched back to remove a portion thereof (e.g., to planarize an upper portion of the contact 122 near an upper surface of the substrate 105). The contract 122 thus facilitates electrical contact between a node near an upper surface of the substrate 105 and the emitter region 112, via the bottom of the trench region 108.

In one implementation, the contact 122 includes N+ doped polysilicon. The N+ doped polysilicon is out-diffused, naturally and/or using an anneal process, to form the N+ cathode-emitter region 112. In this implementation, the implant discussed above, via the bottom portion of the trench region 108, for forming the N+cathode emitter region 112 is replaced and/or complemented by the out-diffusion.

In another implementation, trench regions 106 and 108 are a single trench formed around the thyristor region 110, with the control port 120 formed around at least a portion of the thyristor region. For instance, referring to FIG. 2B of the above-referenced patent document entitled "Trench Isolation for Thyristor-based Device," the control port 120 may be formed similarly extending around the thyristor body region shown therein. A portion of the control port is etched where trench region 108 is shown, such that a portion of the control port abuts a sidewall of the trench region 108. The insulative liner 123 is of the control port abuts a sidewall of the trench region 108. The insulative liner 123 is formed on the portion of the control port that abuts the sidewall of the trench region 108 and insulates the control port 120 from the contact 122 (e.g., as in the memory array discussed in connection with FIG. 2 below).

Figure 1D:
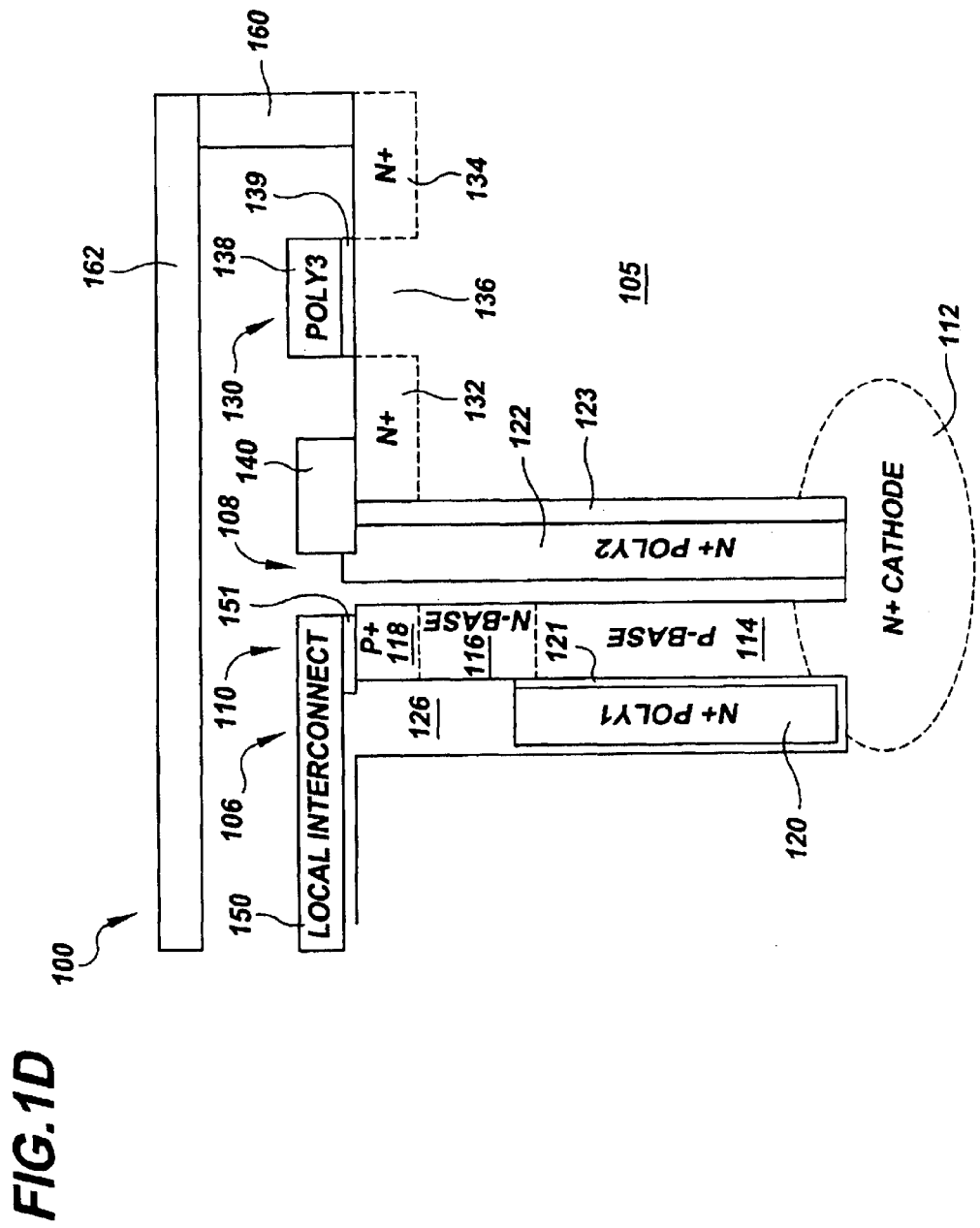

After forming the control port 120 and the contact 122, the remaining portions of the device 100 are formed as shown in FIG. 1D. Thyristor body regions including P-base region 114, N-base region 116 and P+ anode emitter region 118, are implanted in the thyristor region 110. Optionally, the P-base region 114 and N-base region 116 are formed during a blanket implantation of the substrate 105 at an earlier stage in the manufacture of the device 100, such as prior to formation of the trench regions 106 and 108. In either case, the control port 120 is adapted for capacitively coupling primarily to the P-base region 114 via the dielectric 121 for controlling current flow in the thyristor between the N+ cathode emitter 112 and the P+ anode emitter 118. In one specific implementation, the control port 120 is used during memory operations for latching the thyristor in current passing ("on") or current blocking ("off") states. In another implementation, the control port 120 causes an outflow of minority carriers from the P-base region 114 for turning the thyristor into a current blocking state, in response from at least one voltage pulse being applied to the control port. In still another implementation, the control port 120 is adapted for controlling current flow in the thyristor independent of any MOS-inversion channel formation.

After the above-discussed thyristor body regions are formed, a pass device 130 is electrically coupled in series with the N+ cathode emitter region 112. First, a dielectric 139 and a gate electrode material (e.g., polysilicon) 138 are deposited, patterned and etched over the substrate 105. The N+ source/drain regions 132 and 134 are then implanted in the substrate 105, separated by a channel region 136, using the gate electrode for alignment. The gate electrode is adapted for controlling current flow between the source/drain regions 132 and 134 in response to a voltage being applied thereto.

After the thyristor and the pass device are formed, they are electrically coupled to each other and to other circuitry. A contact region 151 is formed on the P+ anode emitter region 118, and interconnect 150 is electrically coupled to the contact region 151 and to other circuitry (not shown) in the device, such as a reference voltage line. Another contact 140 is formed, bridging over the insulative liner 123 and electrically coupling the contact 122 with the N+ source/drain region 132, which in turn couples the pass device 130 in series with the N+ cathode 112. A bit line contact 160 electrically couples the N+ source/drain region 134 to a metal line 162, such that the metal line 162 is electrically coupled to the N+ cathode region 112 when the pass device 130 is in a current-passing mode (e.g., latched in an "on" state). In response to signals applied to the gate 138 and the control port 120, the thyristor-based device 100 is adapted for writing data to and reading data from the N+ cathode emitter region 112 as a function of the state of the thyristor. For example, the read access occurs when electrically coupling the bit line contact 160 to the N+ cathode emitter region 112 via the pass device 130. More specifically, the voltage of the N+ cathode emitter region 112, which is a function of the state of the thyristor, is read out as data to the bit line contact 160.

Figure 1E:
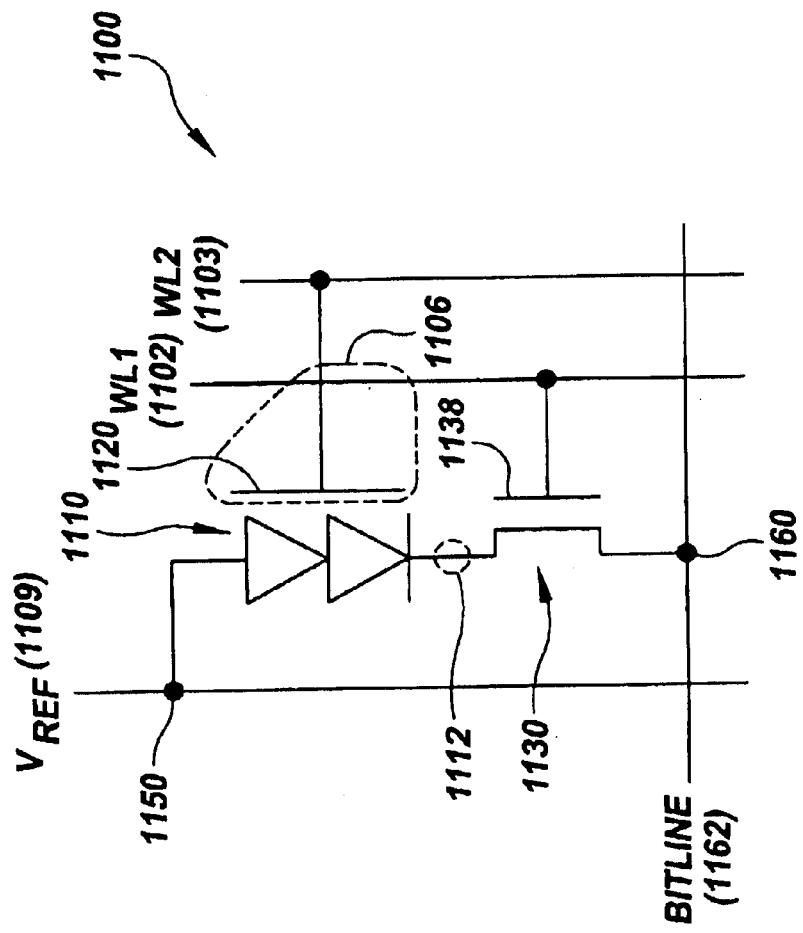
FIG. 1E is a circuit including a thyristor-based device, such as the device shown in FIG. 1D, according to another example embodiment of the present invention.

FIG. 1E is another example circuit arrangement 1100, consistent with a more particular example embodiment of the present invention. The circuit arrangement 1100 may be formed, for example, similarly to the circuit 100 formed in FIGS. 1A–1D, with a thyristor body 1110 and a pass device 1130 (e.g., transistor) electrically coupled in series and adapted for storing data at a storage node 1112. Control ports 1120 and 1138 are adapted to control current flow in the thyristor body 1110 and the pass device 1130, respectively, in response to signals applied to first (WL1) and second (WL2) word lines 1102 and 1103. The control port 1120 is located in a bottom portion of a trench 1106, which is particularly useful for filling trenches with high aspect ratios in high-density applications, as discussed above. A contact 1150 is adapted to electrically couple a signal from a reference voltage (Vref) line 1109 to an emitter region of the thyristor body region 1110. In addition, a bit line contact 1160 is adapted to electrically couple a signal from a bit line 1162 to a source/drain region of the pass device 1130. In response to signals applied to WL1 and WL2, and using signals at the bit line 1162 and Vref line 1109, the device 1100 is adapted for accessing data at the storage node 1112. For more information regarding data storage and manipulation with a thyristor-based device, such as the device 1100, and in particular for controlling current in a thyristor-based device with a capacitively-coupled control port, reference may be made to U.S. Pat. No. 6,229,161 (Nemati et al.).

Various ones of the example embodiments described below in connection with the figures share similar features with each other and with FIGS. 1A–1E. In each of these figures, certain discussion of similar features that are similarly numbered is omitted for brevity.

Figure 2:
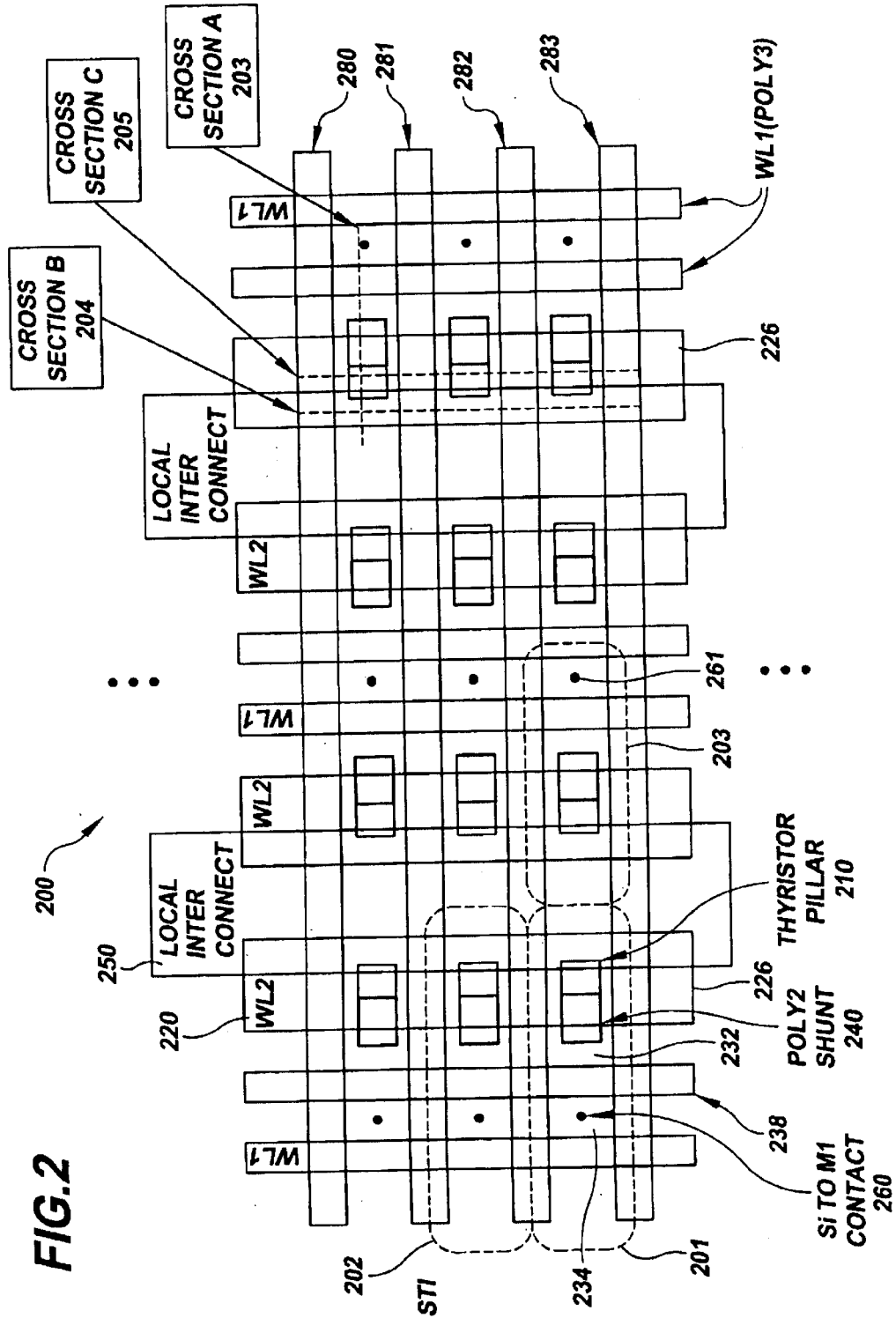
FIG. 2 is a circuit including a memory array, according to another example embodiment of the present invention.

FIG. 2 is a circuit including a memory array 200 having thyristor-based devices, such as thin capacitively-coupled thyristors, according to another example embodiment of the present invention. Each thyristor-based device is formed with a thyristor body region that is adjacent to a control port near a bottom portion of a trench. The memory array includes memory cells, each cell having a thyristor formed in an anode-down or cathode-down arrangement, with a buried emitter region electrically coupled to a pass device. For example, each thyristor-based memory device may be formed using one or more of the cathode-down approaches described above in connection with FIGS. 1A–1D. In some applications, implementations with a cathode-down approach exhibit faster switching times, relative to switching times exhibited with an anode-down approach.

The memory array 200 includes shallow trench isolation (STI) regions 280, 281, 282 and 283 that are formed in a substrate and adapted to electrically isolate portions of adjacent memory cells, such as cells 201 and 202. In one implementation, the STI is used to electrically isolate source/drain regions of adjacent pass devices. In another implementation, the STI is used to form a deep trench that is adapted to isolate buried emitter regions of the thyristor-based devices. For more general information regarding thyristor devices, and for specific information regarding the use of an STI trench to isolate a buried emitter in a manner that can be implemented in connection with one or more example embodiments of the present invention, reference may be made to the above-referenced patent document entitled "Varied Trench Depth for Thyristor Isolation."

A variety of the memory cells in the array 200 share word lines, bit lines and local interconnects. For example, referring to memory cells 201, 202 and 203, word lines 220 and 238 are coupled to cells 201 and 202, with the word line 220 including a thyristor control port and being formed near a bottom of a trench in a manner similar to the control port 120 shown in FIG. 1D. A local interconnect 250 is electrically coupled to cells 201 and 202 and electrically connects emitter regions (e.g. P+ anode emitter region 118 in FIG. 1D) of each cell to a reference voltage. In addition, bit line contacts 260 and 261 of cells 201 and 203, respectively, are electrically coupled to a shared bit line (not shown) that extends parallel to the memory cells and perpendicular to the word lines (e.g., similar to bit line 162 in FIG. 1D).

Referring to memory cell 201 as a representative example cell, a relatively deep trench 226 is formed having two depths and an aspect ratio that inhibits filling the trench with an insulative material. Portions of the deep trench 226 that overlap the STI regions 280–283 are relatively deeper than portions of the deep trench that do not overlap the STI. These relatively deeper portions of the trench 226 result, for example, when the STI regions 280–283 are etched prior to etching the deep trench 226. Thus, the memory cell 201 exhibits three trench depths including the STI trench regions 280–283 that isolate pass devices, the shallower portion of the deep trench 226 that isolates thyristors, and the deeper portion of the deep trench 226 that isolates lower emitter regions of immediately adjacent thyristors.

A thyristor emitter region (e.g., region 212 of FIG. 1D) is implanted via a bottom portion of the deep trench 226 and below a thyristor pillar 210 through an opening where a conductive shunt 240 is to be formed. A control port (WL2) 220 is formed in a bottom portion of deep trench region 226 in a manner that sufficiently reduces the aspect ratio of the unfilled portion of the trench 226 such that insulative material can be used to completely fill the trench over the control port. The control port 220 is adapted to capacitively couple to the thyristor pillar 210. The conductive shunt 240 is also formed in the deep trench 226 and is electrically coupled to the lower emitter region of the thyristor body 210. The conductive shunt 240 is particularly useful, for example, for electrically contacting the lower emitter region to a region near a surface of the device. For general information regarding thyristor devices, and for specific information the use of such a conductive shunt in connection with one or more example embodiments of the present invention, reference may be made to the above-referenced patent document entitled "Shunt Connection to Buried Emitter for Thyristor-based Semiconductor Device."

After the conductive shunt 240 is formed, thyristor body regions (e.g., regions 114, 116 and 118 in FIG. 1D) are implanted in pillar 210, with the control port 220 being adapted to control current flow in the thyristor pillar. A pass device (e.g., a PMOSFET or an NMOSFET for anode-down or cathode-down thyristor implementations, respectively) is coupled in series to the lower emitter via the conductive shunt 240, and includes source/drain regions 232 and 234 separated by a channel region below a first word line (WL1) 238. A bit line contact 260 electrically couples the source/drain region 234 to a "metal1" (M1) bit line.

The memory array shown in FIG. 2 can be implemented using one or more of a variety of memory cells; these cells are represented by example in the cross-sectional figures discussed herein. For example, cross-section A 203 may be implemented using the device shown in FIG. 1D. Additional implementations are represented by cross-sections B (204) and C (205), which may be implemented using the devices shown in FIGS. 3 and 4, respectively, each showing cathode-down implementations. In addition, the array 200 may be extended to include additional memory cells as represented by the dotted lines in FIG. 2.

Figure 3:
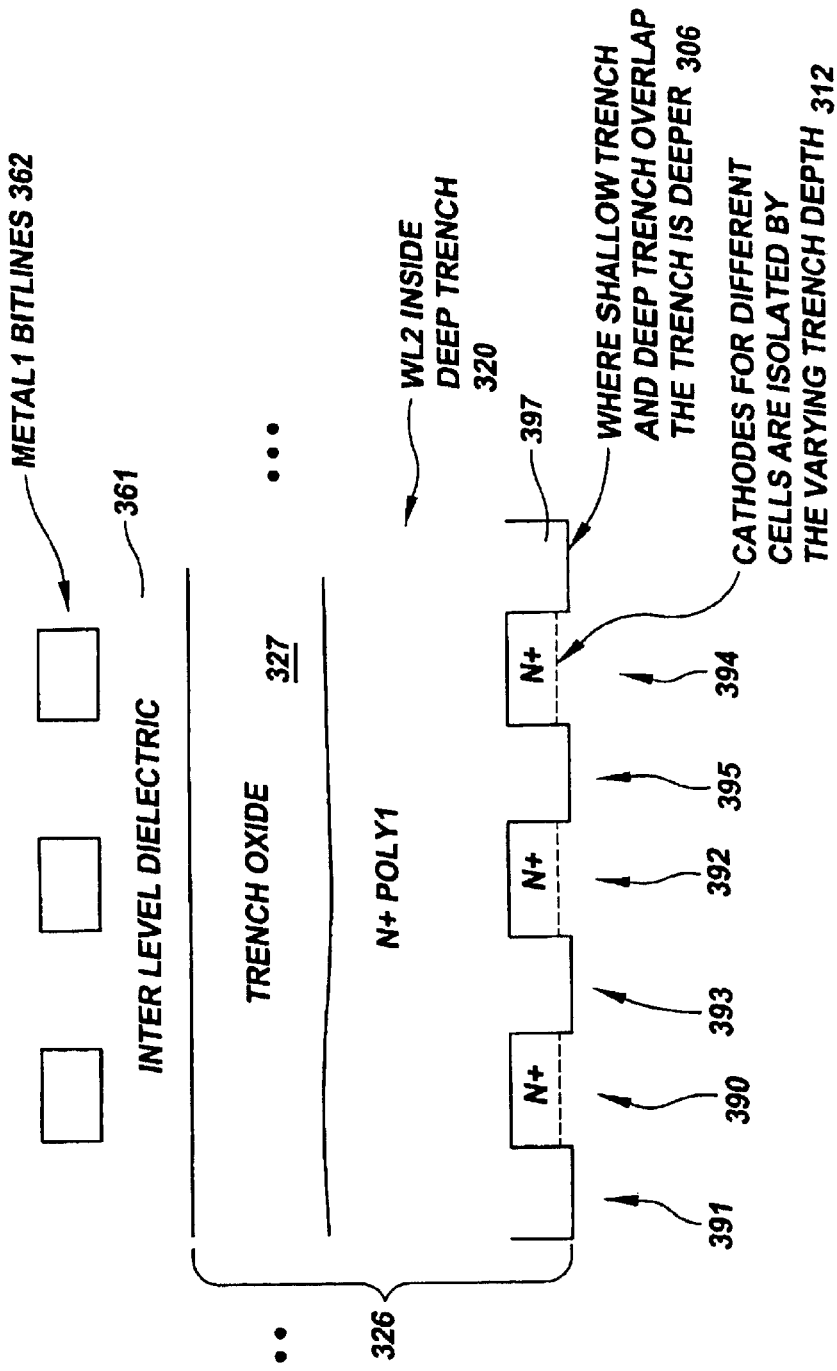
FIG. 3 is a cross-section of FIG. 2, according to another example embodiment of the present invention.

Referring now to FIG. 3, and viewing cross-section B of FIG. 2, a deep trench 326 (e.g., deep trench 226 of FIG. 2) is formed having a varied depth that isolates emitter regions of adjacent memory cells. Trenches for shallow trench isolation (STI), e.g., as discussed above in connection with STI regions 280–283 in FIG. 2, are then formed, and the deep trench 326 is subsequently etched with regions 391, 393, 395 and 397 of the deep trench 326 below the STI being relatively deeper. Polysilicon doped to N+ polarity (N+ poly1) material is deposited near a bottom of the trench to form a thyristor control port (WL2) 320 that is adapted for capacitively coupling to thyristor-based memory cells 390, 392 and 394. N+ cathode regions 390, 392 and 394 are implanted through the bottom of the trench 326 after the WL2 320 is formed (e.g., through a hole were the cathode contact will go), and the deeper regions 391, 393, 395 and 397 electrically isolate the adjacent N+ cathode regions. Oxide material 327 is formed over the N+ poly1 material and in the STI trenches. Inter level dielectric 361 is formed over the trench 326, and "metal1" bit lines, including bit line 362, are formed over the oxide material 327 and electrically coupled to a source/drain region of an adjacent pass device (e.g., source/drain region 232 in FIG. 2). Remaining portions of the memory cells, including thyristor body (see, e.g., FIG. 4) and pass device regions (not shown), are also formed in a manner not inconsistent with the above-discussed embodiments of the present invention. In addition, the memory cells can be extended laterally as shown by the dotted lines.

Figure 4:
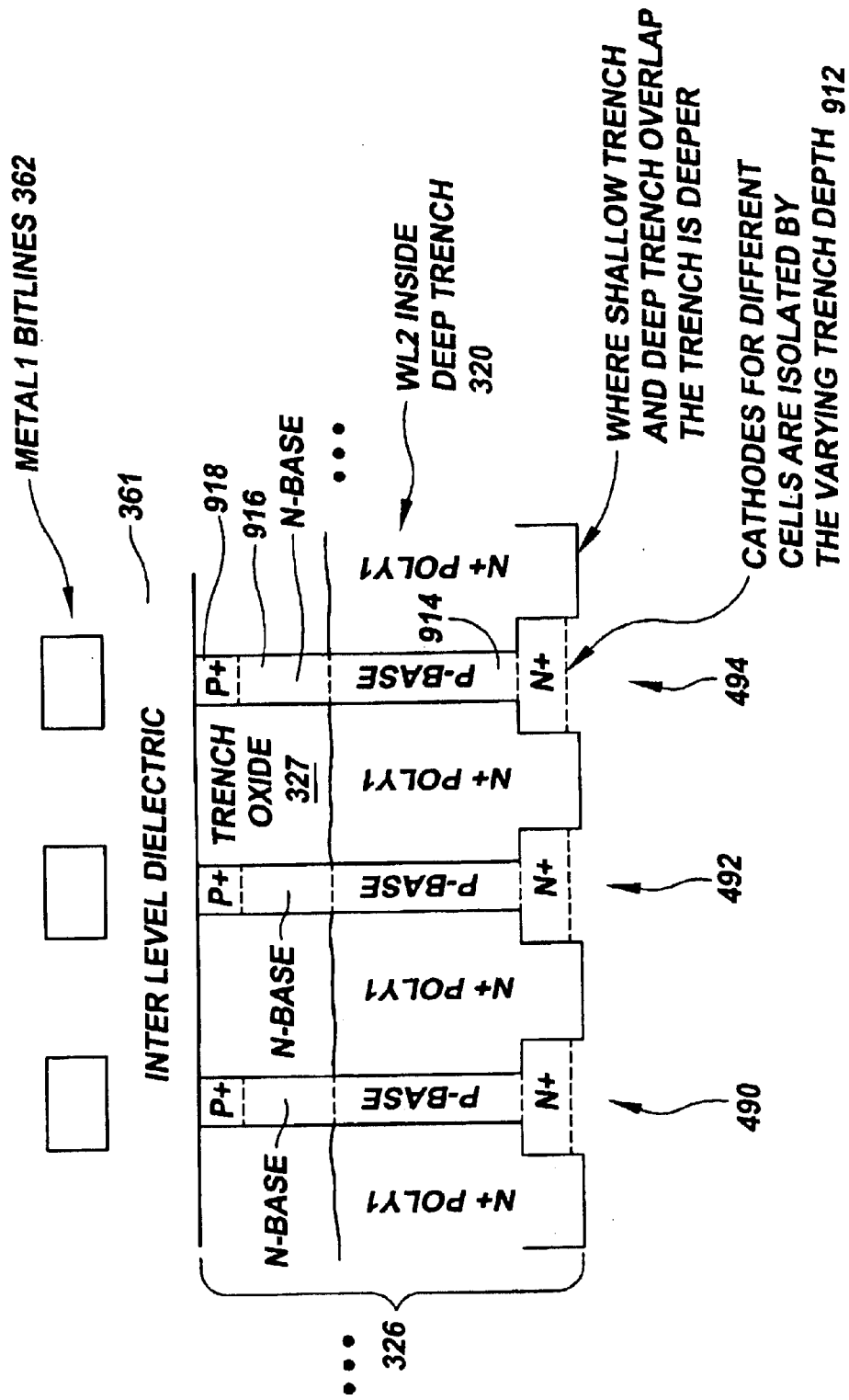
FIG. 4 is another cross-section of FIG. 2, according to another example embodiment of the present invention.

Referring to FIG. 4 and viewing cross-section C of FIG. 2 and cross-section B of FIG. 3, thyristor body regions 490, 492 and 494 are shown having the thyristor control port WL2 320 adapted to capacitively couple to a P-base region (e.g. region 914 of thyristor body 494). The WL2 320 is adapted to fill a lower portion of the deep trench 326 in a manner that reduces the aspect ratio of the trench to be filled, permitting the upper portion of the trench 326 to be filled with the oxide 327 (e.g., as shown in FIG. 1B). Using thyristor body region 494 as a representative example, the body region 494 includes N+ cathode emitter region 912, an implanted P-base region 914, N-base region 916 and P+ anode emitter region 918. Inter level dielectric 361 and M1 bit lines 362 are formed over the body regions, and the bit lines are electrically coupled to a source/drain region of an adjacent pass device in series with the P+ emitter regions. As with the example embodiment of FIG. 3, remaining portions of the memory cell are formed in a manner not inconsistent with previously-described embodiments of the present invention. In addition, the memory cells may be extended laterally as shown by the dotted lines.

Figure 5:
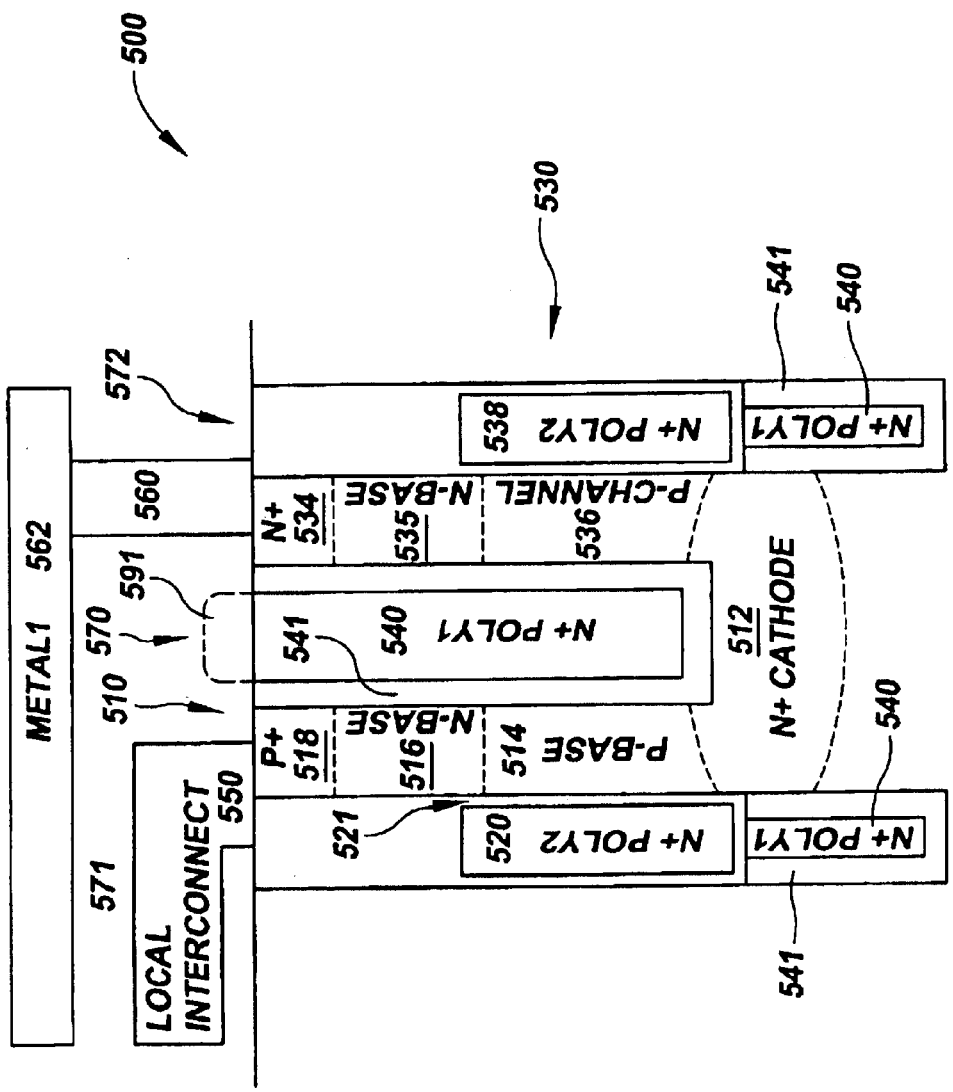
FIG. 5 is a semiconductor device having a high-aspect-ratio trench, according to another example embodiment of the present invention.

FIG. 5 illustrates a cross-sectional view of another thyristor-based semiconductor device 500, according to yet another example embodiment of the present invention. The device 500 includes a cathode-down thyristor, similar to the device 100 shown in FIG. 1D, but having a vertical pass device 530 being electrically coupled in series with a thyristor having a body 510 and a control port 520. The thyristor body 510 includes N+ cathode emitter region 512 implanted via a bottom portion of a trench 570 having an insulative liner 541 and conductive material 540 formed therein. A P-base region 514, an N-base region 516 and a P+ emitter region 518 are over the N+ emitter region 512. The P+ emitter region 518 is electrically coupled to a local interconnect 550.

Similar to trench 570, each of trenches 571 and 572 has an insulative liner 541 and a conductive material 540 formed therein. The combination of the insulative material 541 and the conductive material 540 electrically isolate adjacent thyristor and/or pass device regions (e.g., the adjacent thyristor and pass devices shown in FIG. 2). The conductive material 540 is particularly useful for filling the lower portion of trenches where a high aspect ratio inhibits filling insulative material therein. A portion of the trench 571 is lined with a gate dielectric 521, and the conductive thyristor control port 520 is formed in the trench 571 and adapted to capacitively couple to the P-base region 514 via the dielectric 521.

In one implementation, the trenches 570, 571 and 572 are simultaneously etched, using a sacrificial material 591 over the trench 570. The sacrificial material 591 results in the trench 570 being etched to a lesser depth than the trenches 571 and 572, as shown. The sacrificial material may, for example, include material similar to that in the device 500 where trenches 571 and 572 are etched, or another type of material.

The pass device 530 uses the N+ cathode emitter region 512 as a source/drain region, with P-channel region 536 and an N+ source/drain region 534 that are separated by an N-base region 535. N+ source/drain region 534 is electrically coupled to a metal line 562 (e.g., a bit line) via a contact 560. A control port 538 is formed over the conductive material 540 in trench 572. The control port 538 is adapted to capacitively couple to the P-channel region 536 for controlling current flow between the N+ cathode 512 and the source/drain region 534.

In another implementation, the N-base region 535 in FIG. 5 is omitted, such that P-channel region 536 and N+ source/drain region 534 are contiguously adjacent to one another. However, the arrangement as shown in FIG. 5 is particularly suitable for manufacturing because the N-base 516 and N-base 535 can be simultaneously implanted without necessarily performing a mask step. Furthermore, the P-base 514 and P-channel 536 can also be simultaneously implanted.

Figure 6:
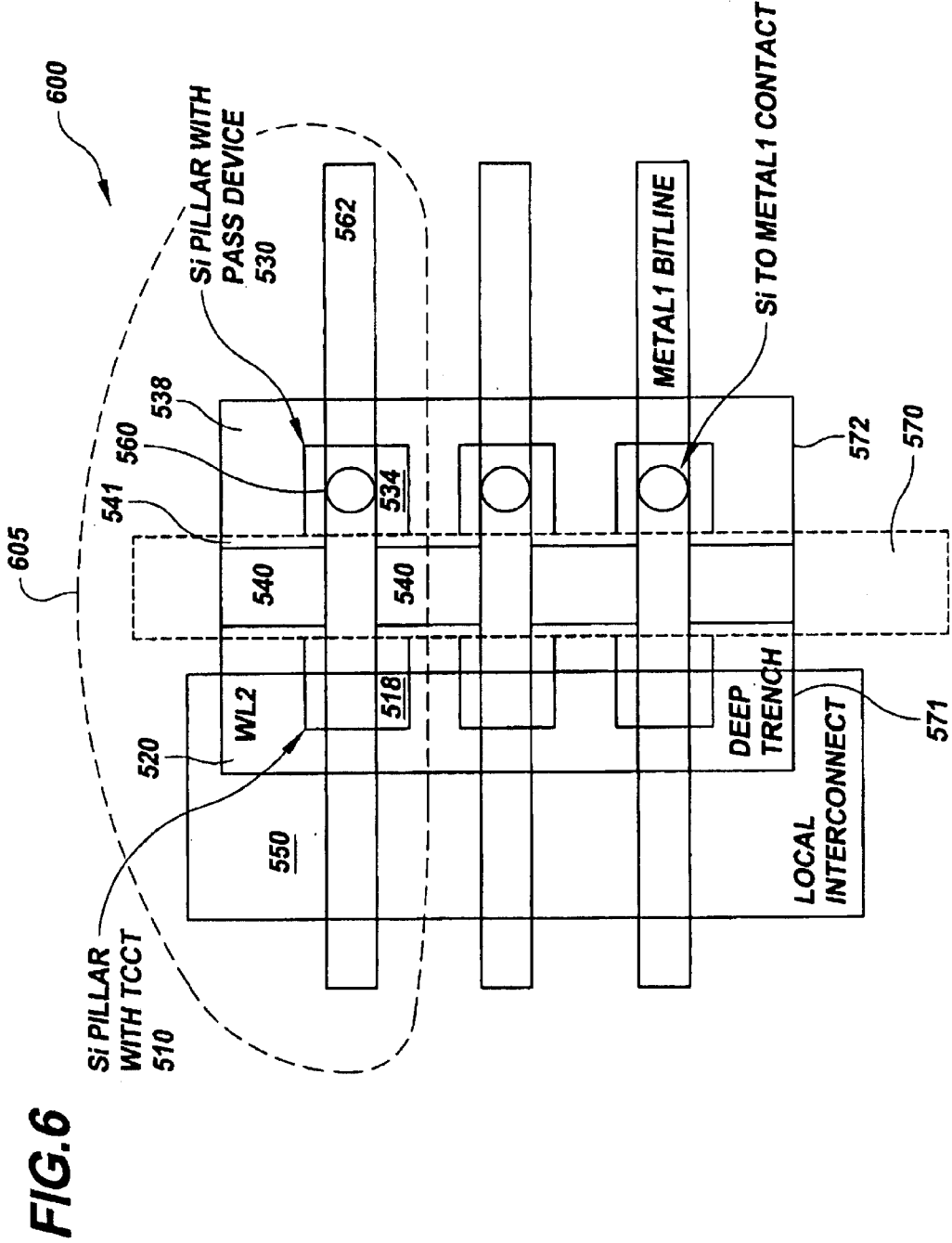
FIG. 6 is a circuit including an array of semiconductor devices, such as the device shown in FIG. 5, according to another example embodiment of the present invention.

FIG. 6 shows a semiconductor memory array 600 that includes a memory cell 605 having the device 500 shown in FIG. 5 and having its articles labeled using reference numbers common to those used in connection with FIG. 5. In addition, various portions of the array 600 are outlined for simplicity, such that elements below the outlined portions can be viewed. Bit line 562 extends laterally over the cell 605, with contact 560 extending from the bit line 562 to the N+ source/drain region 534 of pass device 530 below. The control port 538 for the pass device 530 (shown in FIG. 5) is formed in trench 572 and around the P-channel region 536 (also shown in FIG. 5), which is below the N+ source/drain region 534. The thyristor control port 520 is similarly formed around the thyristor body 510 (e.g., in the formation of a pillar) in trench 571. N+emitter region 518 is coupled to local interconnect 550. Conductive material 540 and insulative material 541 in trench 570 separate and electrically isolate portions of the thyristor body 510 and the pass device 530.

As an alternative approach, any of the above embodiments can be modified using the approach(es) illustrated and described in concurrently-filed U.S. Provisional patent application Ser. No. 60/415,356, entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN body sections in the thyristor; and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161, discussed above, which is fully incorporated herein by reference. Such modifications and changes do not depart from the true spirit and scope of the present invention that is set forth in the following claims.

What is claimed is:

1. A method of manufacturing a semiconductor device having a thyristor body with at least one region in a substrate, the method comprising:

providing a trench in the substrate laterally adjacent to the at least one thyristor body region and having sidewalls;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

filling an upper portion of the trench over the control port and covering the control port;

doping the thyristor body region in the substrate and forming first and second vertically-adjacent base regions of opposite polarity, the second base region being over the first base region, wherein the thyristor control sort is configured and arranged to capacitively couple to the first base region via the dielectric and to control current in the thyristor body;

implanting a region of the device below the trench and forming a first emitter region, the first emitter region being immediately adjacent to the first base region; and forming a second emitter region electrically coupled to the second base region.

2. The method of claim 1, wherein the first emitter region and the first base region form a cathode end portion of the thyristor body, and wherein the second emitter region and the second base region form an anode end portion of the thyristor.

3. The method of claim 1, further including forming a conductor in the substrate and opposite the thyristor from the at least one region of the thyristor body, the conductor being adapted to electrically couple to the first emitter region.

4. The method of claim 3, wherein forming the conductor includes forming a conductor that electrically couples the first emitter region to a pass device.

5. The method of claim 1, wherein implanting a first base region includes implanting a first implant region below and adjacent to a lower portion of the trench, prior to implanting the first emitter region, wherein implanting the first emitter region includes implanting the first emitter region in the first implant region below the trench, a remaining portion of the first implant region forming the first base region.

6. A method of manufacturing a semiconductor device having a thyristor body with at least one region in a substrate, the method comprising:

providing a trench in the substrate laterally adjacent to the at least one thyristor body region and having sidewalls;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

filling an upper portion of the trench over the control port and covering the control port; doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body;

implanting a region of the device below the trench and forming a first emitter region, the first emitter region being immediately adjacent to the first base region and wherein the first emitter region and the first base region form an anode end portion of the thyristor body; and forming a second emitter region electrically coupled to the second base region wherein the second emitter region and the second base region form a cathode end portion of the thyristor body.

7. A method of manufacturing a semiconductor device having a thyristor body with at least one region in a substrate, the method comprising:

providing a trench in the substrate laterally adjacent to the at least one thyristor body region and having sidewalls;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

filling an upper portion of the trench over the control port and covering the control port; doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body;

implanting a region of the device below the trench and forming a first emitter region, the first emitter region being immediately adjacent to the first base region;

forming a second emitter region electrically coupled to the second base region;

forming a pass device having first and second source/drain regions separated by a channel and a gate over the channel, the gate being adapted to switch the pass device between a blocking state and a conducting state in response to a voltage being applied thereto; and electrically coupling the first emitter region to the first source/drain region.

8. The method of claim 7, further including electrically coupling the second source/drain region to a bit line and electrically coupling the gate to a first word line, the pass device being adapted to electrically couple the first emitter region to the bit line in response to a voltage applied to the first word line.

9. A method of manufacturing a semiconductor device having a thyristor body with at least one region in a substrate, the method comprising:

providing a trench in the substrate laterally adjacent to the at least one thyristor body region and having sidewalls;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

filling an upper portion of the trench over the control port and covering the control port;

doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body;

implanting a region of the device below the trench and forming a first emitter region including implanting the first emitter region via an opening for a conductive shunt contact to the first emitter region, and forming a conductive in the opening, the first emitter region being immediately adjacent to the first base region; and forming a second emitter region electrically coupled to the second base region.

10. A method of manufacturing a semiconductor device having a thyristor body with at least one region in a substrate, the method comprising:

providing a trench in the substrate laterally adjacent to the at least one thyristor body region and having sidewalls and further including having a height-to-width aspect ratio that is prohibitive to filling a bottom portion of the trench with insulative material used to fill the upper portion of the trench over the control port;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

filling an upper portion of the trench over the control port and covering the control port; and doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body.

11. A method of manufacturing a semiconductor device having a thyristor body with at least one region in a substrate, the method comprising:

providing a trench in the substrate laterally adjacent to the at least one thyristor body region and having sidewalls and further including having a height-to-width aspect ratio of at least 2:1;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench including depositing a conductive material adapted to fill a bottom portion of a trench having a height-to-width aspect ratio greater than 2:1;

filling an upper portion of the trench over the control port and covering the control port; and doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body.

12. A method of manufacturing a semiconductor device having a thyristor body with at least one region in a substrate, the method comprising:

providing a trench in the substrate laterally adjacent to the at least one thyristor body region and having sidewalls and further including providing the trench between the at least one thyristor region and a sinker region that is adapted to make electrical contact to an emitter region of the thyristor;

forming a dielectric on one of the sidewalls in the trench facing the thyristor body region;

forming a thyristor control port in a lower portion of the trench and thereby providing a partially-filled trench with an effectively reduced height-to-width aspect ratio of the provided trench;

electrically insulating the thyristor control port from the sinker region;

filling an upper portion of the trench over the control port and covering the control port; and doping the thyristor body region in the substrate and forming first and second vertically-adjacent base regions of opposite polarity, the second base region being over the first base region, wherein the thyristor control port is configured and arranged to capacitively couple to the first base region via the dielectric and to control current in the thyristor body.

13. A method for manufacturing a memory arrangement having a memory cell including a thyristor and a pass gate electrically coupled in series with the thyristor, the thyristor having at least one body region in a substrate, the method comprising:

etching a trench in the substrate, the trench having sidewalls and being adjacent to the thyristor body region;

implanting a portion of the substrate below the trench and forming a first emitter region of the thyristor;

forming a gate dielectric on one of the sidewalls of the trench facing the dopable portion;

forming a first word line including a thyristor gate in a bottom portion of the trench, the thyristor gate being adapted to capacitively couple to the thyristor body region via the gate dielectric, thereby providing a partially-filled trench having a reduced aspect ratio;

filling an upper unfilled portion of the trench over the control port with insulative material;

doping the thyristor body region and forming first and second thyristor base regions laterally adjacent to the gate electrode and electrically coupled to one another, the first thyristor base region being electrically coupled to the first emitter region and the second thyristor base region being over the first thyristor base region;

forming a second emitter region of the thyristor coupled to the second base region, wherein the thyristor control port is capacitively coupled to the first base region and is adapted to control current flow in the thyristor via the capacitive coupling to the first base region; and forming a second word line including a gate for a pass device being electrically coupled in series with the second emitter region and adapted to control current flow between the second emitter region and a bit line, wherein the pass device and the thyristor are adapted to read data from and write data to the second emitter region in response to signals at the first and second word lines.

* * * * *

UNITED STATES PATENT AND TRADEMARK OFFICE
CERTIFICATE OF CORRECTION

PATENT NO. : 6,913,955 B1
APPLICATION NO. : 10/262792
DATED : July 5, 2005
INVENTOR(S) : Horch et al.

Page 1 of 1

It is certified that error appears in the above-identified patent and that said Letters Patent is hereby corrected as shown below:

<u>In the Specification</u>

Col. 5, line 55: "N+cathode" should read --N+ cathode--.

Col. 10, line 46: thc" should read --the--.

Col. 10, line 49: "N+emitter" should read --N+ emitter --.

<u>In the Claims</u>

Col. 11, line 32, Claim 1: "sort" should read --port--.

Signed and Sealed this

Sixth Day of February, 2007

JON W. DUDAS
*Director of the United States Patent and Trademark Office*